United States Patent
Tsuchida et al.

(10) Patent No.: US 12,227,830 B2
(45) Date of Patent: Feb. 18, 2025

(54) YTTRIUM INGOT AND SPUTTERING TARGET IN WHICH THE YTTRIUM INGOT IS USED

(71) Applicant: TOSOH CORPORATION, Shunan (JP)

(72) Inventors: Yuya Tsuchida, Ayase (JP); Masami Mesuda, Ayase (JP); Hiroyuki Hara, Ayase (JP); Osamu Matsunaga, Ayase (JP)

(73) Assignee: TOSOH CORPORATION, Shunan (JP)

( * ) Notice: Subject to any disclaimer, the term of this patent is extended or adjusted under 35 U.S.C. 154(b) by 121 days.

(21) Appl. No.: 17/996,718

(22) PCT Filed: Apr. 19, 2021

(86) PCT No.: PCT/JP2021/015798
§ 371 (c)(1),
(2) Date: Oct. 20, 2022

(87) PCT Pub. No.: WO2021/215376
PCT Pub. Date: Oct. 28, 2021

(65) Prior Publication Data
US 2023/0212734 A1   Jul. 6, 2023

(30) Foreign Application Priority Data

| Apr. 23, 2020 | (JP) | 2020-076659 |
| Apr. 23, 2020 | (JP) | 2020-076665 |
| May 14, 2020 | (JP) | 2020-085139 |
| May 14, 2020 | (JP) | 2020-085189 |

(51) Int. Cl.
| H01J 37/34 | (2006.01) |
| B22D 7/00 | (2006.01) |
| C23C 14/18 | (2006.01) |
| C23C 14/34 | (2006.01) |
| C23C 14/58 | (2006.01) |

(52) U.S. Cl.
CPC ........... *C23C 14/185* (2013.01); *B22D 7/005* (2013.01); *C23C 14/3414* (2013.01); *C23C 14/5853* (2013.01); *H01J 37/3426* (2013.01); *H01J 37/3491* (2013.01)

(58) Field of Classification Search
None
See application file for complete search history.

(56) References Cited

U.S. PATENT DOCUMENTS

| 2006/0237303 A1* | 10/2006 | Hosoya | C23C 14/14 204/192.1 |
| 2014/0140884 A1 | 5/2014 | Takahata | |
| 2019/0177176 A1* | 6/2019 | Inoue | C01G 15/00 |
| 2020/0235247 A1* | 7/2020 | Oyama | C04B 35/457 |

FOREIGN PATENT DOCUMENTS

| CN | 1257998 C | 5/2006 | |
| CN | 101239832 A | * 8/2008 | |
| CN | 107904561 | 4/2018 | |
| CN | 110997972 A | 4/2020 | |
| JP | 6-128738 A | 5/1994 | |
| JP | 3458871 | 10/2003 | |
| JP | 2006-307311 A | 11/2006 | |
| JP | WO2013/005349 A1 | 1/2013 | |
| JP | 2013-256443 A | 12/2013 | |
| JP | WO2020/090977 A1 | 5/2020 | |
| TW | 200835799 A | 9/2008 | |
| WO | WO-2013005349 A1 * | 1/2013 | ............. C22B 59/00 |
| WO | WO 2018/220989 A1 | 12/2018 | |
| WO | WO-2019026818 A1 * | 2/2019 | ........... C23C 14/083 |

OTHER PUBLICATIONS

International Search Report issued Jul. 6, 2021 in PCT/JP2021/015798 filed on Apr. 19, 2021, citing documents 1 & 15-17 therein, 3 pages.

Lei et al., "Study on reactive sputtering of yttrium oxide: Process and thin film properties", Surface & Coatings Technology, vol. 276, 2015, pp. 39-46.

* cited by examiner

*Primary Examiner* — Jason Berman
(74) *Attorney, Agent, or Firm* — Oblon, McClelland, Maier & Neustadt, L.L.P.

(57) ABSTRACT

Provided is an yttrium ingot from which an yttrium sputtering target that produces a reduced number of particles can be obtained, and an yttrium sputtering target that has high plasma resistance and a low resistance that enables realization of a high film deposition rate can be obtained.

An yttrium ingot, wherein the yttrium ingot has a fluorine atom content of less than or equal to 10 wt %; in an instance where the yttrium ingot constitutes a target, a sputtering surface of the target has a surface roughness of 10 nm or greater and 2 μm or less; in the yttrium ingot, the number of pores having a diameter of greater than or equal to 100 μm is fewer than or equal to $0.1/cm^2$; and the yttrium ingot has a relative density of greater than or equal to 96%.

18 Claims, No Drawings

YTTRIUM INGOT AND SPUTTERING TARGET IN WHICH THE YTTRIUM INGOT IS USED

CROSS-REFERENCE TO RELATED APPLICATIONS

The present application is a 35 U.S.C. § 371 national stage patent application of International patent application PCT/JP2021/015798, filed on Apr. 19, 2021, which is based on and claims the benefits of priority to Japanese Application No. 2020-076659, filed on Apr. 23, 2020, Japanese Application No. 2020-076665, filed on Apr. 23, 2020, Japanese Application No. 2020-085139, filed on May 14, 2020, and Japanese Application No. 2020-085189, filed on May 14, 2020. The entire contents of all of the above applications are incorporated herein by reference.

TECHNICAL FIELD

The present invention relates to an yttrium ingot for film formation and to a sputtering target in which the yttrium ingot is used.

BACKGROUND ART

In the production of semiconductor devices, dry etching microfabrication that uses a halogen-based gas or plasma, which is highly corrosive, is one of the important steps. Examples of halogen-based gases and plasmas include those containing fluorine and those containing chlorine. It is known that such corrosive gases and plasmas corrode and damage constituent components of semiconductor manufacturing apparatuses and, consequently, cause formation of particles, which degrades the quality of devices. Many of the constituent components of semiconductor manufacturing apparatuses are consumables, which are periodically replaced to prevent a reduction in the yield and degradation in quality due to the damage. A problem exists in that shutdown due to replacement of components or maintenance of the apparatus reduces the apparatus utilization rate, which decreases productivity. Accordingly, for the semiconductor manufacturing process, there is a need for the development of constituent components having excellent plasma resistance and gas corrosion resistance.

The miniaturization of semiconductor devices has resulted in an increased density of the plasma that is used in dry etching processes, and attention is now focused on yttrium oxide, which can possibly be a material that is resistant to high-density plasma. Components containing yttrium oxide can be manufactured with a method that forms an yttrium oxide film on a substrate with a thermal spray process, as disclosed in Patent Literature 1. This is a mainstream industrial process used from the standpoint of manufacturing cost and increasing size. Unfortunately, the film formation with a thermal spray process, in which a ceramic powder is melted and then rapidly solidified, results in the presence of surface defects and voids in a surface of the film. The presence of such defects degrades plasma resistance and, in addition, can cause the formation of particles, and, accordingly, there is a need for a method for forming a dense yttrium oxide film with high efficiency.

One method for forming a film other than the thermal spray process is the sputtering method. The sputtering is a method in which cations, such as Ar ions, are physically bombarded on a target provided at a cathode, to cause a material that forms the target to be emitted by the bombardment energy, thereby depositing a film on a substrate provided at an opposite position. Examples of the sputtering method include direct current sputtering method (DC sputtering method), radio-frequency sputtering method (RF sputtering method) and alternating-current sputtering method (AC sputtering method). In general, it is believed that in instances where a sputtering method is used for film formation, the film can be deposited with a low-temperature process compared with film formation that uses a thermal spray process, and, therefore, formation of defects, such as voids, can be inhibited, which makes it possible to form a denser film. Furthermore, in instances where a sputtering method is used for film deposition, a film of an oxide or a nitride can be deposited by performing the film deposition by reactive sputtering, which introduces a gas such as oxygen or nitrogen into a sputtering chamber. For example, as described in Non-Patent Literature 1, an yttrium oxide film can be deposited on a substrate by reactive DC sputtering in which a DC discharge is performed on an yttrium target, and oxygen is introduced during sputtering. However, the quality of the formed film varies significantly depending on the sputtering conditions. It should be noted that according to Non-Patent Literature 1, the film deposition was performed with an yttrium target having a purity of 99.5%; however, a thorough investigation was not performed regarding correlations between physical properties of the sputtering target, such as a density and a purity, and sputtering properties thereof and relationships between the physical properties and the quality of films formed by sputtering. Accordingly, there is a need for further investigation of physical properties of yttrium targets, sputtering properties thereof and features of the films that are formed.

CITATION LIST

Patent Literature

PTL 1: Japanese Unexamined Patent Application Publication No. 2006-307311

Non Patent Literature

NPL 1: P. Lei et al. Surface & Coatings Technology 276 (2015) 39-46

SUMMARY OF INVENTION

Technical Problem

An object of the present invention is to provide an yttrium ingot and a sputtering target in which the yttrium ingot is used. The yttrium ingot is an yttrium ingot for an yttrium sputtering target with a reduced number of particles and for an yttrium sputtering target that has high plasma resistance and a low resistance that enables realization of a high film deposition rate.

Solution to Problem

The present inventors diligently performed studies regarding yttrium ingots that are desirable for yttrium sputtering targets and, consequently, discovered an yttrium ingot from which an yttrium sputtering target that produces a reduced number of particles can be obtained, and an yttrium sputtering target that has high plasma resistance and a low resistance that enables realization of a high film deposition rate can be obtained. Accordingly, the present invention was completed.

Specifically, aspects of the present invention are as follows.

(1) An yttrium ingot, characterized in that the yttrium ingot has a fluorine atom content of less than or equal to 10 wt %; in an instance where the yttrium ingot constitutes a target, a sputtering surface of the target has a surface roughness of 10 nm or greater and 2 μm or less; in the yttrium ingot, the number of pores having a diameter of greater than or equal to 100 μm is fewer than or equal to $0.1/cm^2$; and the yttrium ingot has a relative density of greater than or equal to 96%.
(2) The yttrium ingot according to (1), characterized in that the yttrium ingot has an average grain size (D50) of less than or equal to 3000 μm.
(3) The yttrium ingot according to (1) or (2), characterized in that 98≤100−RE−M<99.999, where RE is a rare earth metal content in wt %, and M is a non-rare-earth metal content in wt %.
(4) The yttrium ingot according to (1), characterized in that the fluorine atom content is 0.05 wt % or greater and 10 wt % or less.
(5) The yttrium ingot according to (4), wherein the yttrium ingot contains yttrium oxyfluoride.
(6) The yttrium ingot according to (4) or (5), wherein 98≤100−RE<99.999, where RE is a rare earth metal content in wt %.
(7) The yttrium ingot according to any one of (4) to (6), wherein the yttrium ingot has an average grain size (D50-2) of less than or equal to 100 μm.
(8) The yttrium ingot according to any one of (4) to (7), wherein the yttrium ingot has a volume resistivity of less than or equal to 1 Ω·cm.
(9) An yttrium sputtering target characterized by comprising the yttrium ingot according to any one of (1) to (8).
(10) The sputtering target according to (9) comprising a backing plate and the yttrium ingot.
(11) The yttrium sputtering target according to (9) or (10), characterized in that a bonding ratio between the backing plate and the yttrium ingot is greater than or equal to 90%.
(12) A method for manufacturing an yttrium oxide film, the method being characterized by comprising performing sputtering with the yttrium sputtering target according to any one of (9) to (11).

Advantageous Effects of Invention

The yttrium ingot of the present invention has a smooth surface and a reduced amount of a surface oxidation layer. Accordingly, in instances where the yttrium ingot is used as a sputtering target, stable discharge characteristics can be obtained because an influence of an oxidized, high-resistance area is not present, and, consequently, high productivity can be achieved.

DESCRIPTION OF EMBODIMENTS

The present invention will be described in detail below.

The present invention is an yttrium ingot, which is an yttrium ingot for an yttrium sputtering target that produces a reduced number of particles. The yttrium ingot has a fluorine atom content of less than or equal to 10 wt %. In an instance where the yttrium ingot constitutes a target, a sputtering surface of the target has a surface roughness of 10 nm or greater and 2 μm or less. In the yttrium ingot, the number of pores having a diameter of greater than or equal to 100 μm is fewer than or equal to $0.1/cm^2$. The yttrium ingot has a relative density of greater than or equal to 96%.

The fluorine atom content is less than or equal to 10 wt %. If the fluorine atom content is greater than 10 wt %, the ingot has an increased resistivity, and, consequently, a DC discharge, which is highly productive, cannot be carried out.

In the instance where the yttrium ingot constitutes a target, the surface roughness of the sputtering surface is 10 nm or greater and 2 μm or less and is preferably 10 nm or greater and 1 μm or less and more preferably 10 nm or greater and 0.3 μm or less. When the surface roughness is less than or equal to 2 μm, a surface layer has a reduced specific surface area, and, consequently, an amount of surface oxygen of the yttrium, which is susceptible to oxidation, is reduced. As a result, the occurrence of arcing and an abnormal discharge due to an increased resistivity during the film deposition can be prevented. When the surface roughness is greater than or equal to 10 nm, particles, which are inevitably produced during sputtering although the number thereof is very small, can be redeposited on the surface of the target, which can inhibit deposition of the particles on a film.

The number of pores having a diameter of greater than or equal to 100 μm is fewer than or equal to $0.1/cm^2$. The number is preferably fewer than or equal to $0.01/cm^2$ and more preferably fewer than or equal to $0.005/cm^2$. If a large number of pores having a diameter of greater than or equal to 100 μm are present, an abnormal discharge and/or particles can be caused during sputtering.

The relative density is greater than or equal to 96% and is preferably greater than or equal to 98%, more preferably greater than or equal to 99% and even more preferably greater than or equal to 99.8%. If the relative density is less than 96%, the ingot can easily cracks, which is particularly true if the ingot is large, and, consequently, the ingot cannot be manufactured in good yield. Furthermore, in instances where such an ingot is used, if sputtering is performed with high power, cracking is likely to occur during the discharging, which can cause a reduction in productivity for the film deposition process. Accordingly, using such an ingot is not preferable.

Preferably, the yttrium ingot has an average grain size (D50) of less than or equal to 3000 μm. The average grain size is preferably 1 μm or greater and 2000 μm or less, more preferably 1 μm or greater and 1500 μm or less and particularly preferably 1 μm or greater and 1000 μm or less.

Regarding a content of impurities in the yttrium ingot, it is preferable that 98≤100−RE−M<99.999, where RE is a rare earth metal content in wt %, and M is a non-rare-earth metal content in wt %. More preferably, 99≤100−RE−M<99.999, and even more preferably, 99.9≤100−RE−M<99.999. In instances where the amount of impurities is reduced to increase purity of an yttrium sputtering target, an abnormal discharge and the formation of particles can be inhibited. Further increasing the purity is not preferable because, in such a case, the process of purification is complex, which increases the manufacturing cost. The present inventors investigated the correlations between the amount of impurities and the discharge characteristics within the above-mentioned ranges and determined the purity that can be suitably employed for film deposition performed by sputtering.

Preferably, the yttrium ingot has a volume resistivity of 0.00001 Ω·cm or greater and 1 Ω·cm or less, and more preferably, 0.00001 Ω·cm or greater and 0.001 Ω·cm or less. Yttrium is very susceptible to oxidation, and the oxidation proceeds naturally in the air. The yttrium oxide formed by oxidation is an insulator and, therefore, can cause an abnormal discharge during the sputtering discharge, in particular, for example, in instances in which film deposition is carried out with a DC discharge. When the volume resistivity is within either of the above-mentioned ranges, stable discharge characteristics can be obtained with DC sputtering, RF sputtering or AC sputtering regardless of which of these is used.

The yttrium ingot can be ground to have a plate shape, by using a machining tool, such as a surface grinder, a cylindrical grinder, a lathe, a cutting machine or a machining center.

Methods for manufacturing the yttrium ingot of the present invention are not particularly limited. In instances where melt-solidification involving, for example, vacuum melting or EB melting for achieving high purity, is used, pores having a diameter of greater than or equal to 100 μm are likely to be formed as a result of vaporization during the melting. As such, merely with the melt-solidification, it is difficult to obtain an ingot having a reduced number of pores. Accordingly, it is preferable that the ingot produced by a melting method be compressed by using a hot isostatic pressing method (HIP method) to collapse pores. Note that it is preferable that an outer periphery of the ingot be sealed with a metal because yttrium is a material susceptible to oxidation. It is preferable that a temperature for the HIP be less than or equal to 1000° C. Furthermore, it is preferable that a pressure be less than or equal to 100 MPa because yttrium is relatively brittle. In these cases, the resulting yttrium ingot can be one in which the number of pores having a diameter of greater than or equal to 100 μm is reduced.

The yttrium ingot of the present invention may be an yttrium ingot having a fluorine atom content of 0.05 wt % or greater and 10 wt % or less (hereinafter also referred to as a "fluorine-containing yttrium ingot"). This is preferable because, in this case, the yttrium ingot can be an ingot for an yttrium sputtering target that has high plasma resistance and a low resistance that enables realization of a high film deposition rate. More preferably, the fluorine atom content is 0.05 wt % or greater and 8 wt % or less, 0.05 wt % or greater and 5 wt % or less or 0.1 wt % or greater and 4 wt % or less. More preferably, the fluorine atom content is 0.2 wt % or greater and 3 wt % or less. If the fluorine atom content is less than 0.05 wt %, an improvement in plasma resistance due to an effect of the addition of fluorine is not achieved.

As used herein, the expression "fluorine atom content" is an amount representing a weight ratio of the fluorine atoms in the entirety of the yttrium ingot, and the amount can be measured by Glow Discharge Mass Spectrometry (GDMS) or Inductively Coupled Plasma (ICP).

It is preferable that the fluorine-containing yttrium ingot contain yttrium oxyfluoride. In the instance where yttrium oxyfluoride is included, a failure to form yttrium oxyfluoride during sputtering, which may be caused by a compositional deviation, can be inhibited. There are many types of yttrium oxyfluoride (YOF) compounds. It is preferable that the yttrium oxyfluoride be present primarily as trigonal YOF. Since trigonal YOF has high stability, high mechanical properties can be eventually achieved. Furthermore, an abundance ratio of the trigonal YOF, in terms of area, is preferably 0.1% or greater and 35% or less, more preferably 0.1% or greater and 20% or less and even more preferably 0.1% or greater and 10% or less. When any of these ranges is satisfied, a stable discharge can be achieved, and a film containing yttrium oxyfluoride can be produced.

In the fluorine-containing yttrium ingot, fluorine is present in a specified amount; regarding a content of impurities other than fluorine, it is preferable that $98 \leq 100-RE < 99.999$, where RE is a rare earth metal content in wt %. More preferably, $99 \leq 100-RE < 99.999$, and even more preferably, $99.9 \leq 100-RE < 99.999$. In instances where the amount of rare earth metal impurities is reduced to increase purity of an yttrium target, an abnormal discharge and the formation of particles can be inhibited. Further increasing the purity is not preferable because, in such a case, the process of purification is complex, which increases the manufacturing cost. The present inventors investigated the correlations between the amount of impurities and the discharge characteristics within the above-mentioned ranges and determined the purity that can be suitably employed for film deposition performed by sputtering. As used herein, the term "rare earth metal" refers to Ce, Pr, Nd, Sm, Eu, Gd, Tb, Dy, Ho and Er.

Preferably, the fluorine-containing yttrium ingot has an average grain size (D50-2) of less than or equal to 100 μm. The average grain size is preferably 0.1 μm or greater and 100 μm or less, preferably 0.1 μm or greater and 75 μm or less and particularly preferably 0.1 μm or greater and 20 μm or less. The reduced average grain size is achieved by uniformly dispersing an yttrium fluorine compound in the yttrium ingot. Consequently, the resulting yttrium ingot is one in which high strength is maintained even when yttrium oxyfluoride is present. With a sputtering target in which such an ingot is used, high-rate film deposition with high power can be carried out. Furthermore, since fluorine is uniformly dispersed, compositional variations in films can be reduced.

Preferably, the fluorine-containing yttrium ingot has a volume resistivity of less than or equal to 1 Ω·cm. The volume resistivity is more preferably 0.00001 Ω·cm or greater and 1 Ω·cm or less and even more preferably, 0.00001 Ω·cm or greater and 0.001 Ω·cm or less. Yttrium is very susceptible to oxidation, and the oxidation proceeds naturally in the air. The yttrium oxide formed by oxidation is an insulator and, therefore, can cause an abnormal discharge during the sputtering, in particular, for example, in instances in which film deposition is carried out with a DC discharge. When the volume resistivity is within the above-mentioned ranges, stable discharge characteristics can be obtained with DC sputtering, RF sputtering or AC sputtering regardless of which of these is used.

The fluorine-containing yttrium ingot can be ground to have a plate shape, by using a machining tool, such as a surface grinder, a cylindrical grinder, a lathe, a cutting machine or a machining center.

Methods for manufacturing the fluorine-containing yttrium ingot are not particularly limited. It is preferable to use a manufacturing method in which a reduction process with yttrium fluoride is performed for incorporation of a certain amount of fluorine, and subsequently, melt-solidification is performed by vacuum melting or EB melting, for instance.

Yttrium fluoride is a relatively stable substance and, in addition, enables the formation of yttrium oxyfluoride through reduction. By controlling the reduction state, a necessary amount of fluorine can be retained, and, accordingly, the synthesized yttrium ingot can be one that contains a specified amount of fluorine with the fluorine being uniformly dispersed. Using a chloride as a starting material is not preferable because, in this instance, uniform inclusion of fluorine cannot be achieved.

In instances where melt-solidification that uses, for instance, vacuum melting or EB melting is employed, coarse pores of greater than or equal to 100 μm are likely to be formed as a result of vaporization during the melting. Accordingly, merely with the melt-solidification, it is difficult to obtain an ingot having a reduced number of pores. Accordingly, it is preferable that the ingot produced by a melting method be compressed by using a hot isostatic pressing method (HIP method) to collapse pores. Note that it is preferable that an outer periphery be sealed with a metal because yttrium is a material susceptible to oxidation. It is preferable that a temperature for the HIP be less than or equal to 1000° C. Furthermore, it is preferable that a pressure be less than or equal to 100 MPa because yttrium is relatively brittle. In these cases, the resulting yttrium ingot can be one in which the number of pores of greater than or equal to 100 μm is reduced.

The yttrium ingot of the present invention can constitute a sputtering target made of an yttrium ingot. Regarding methods for manufacturing the sputtering target, the yttrium ingot may, as necessary, be bonded to a backing plate or backing tube formed of oxygen-free copper, titanium or the like, with an indium solder or the like, to obtain the sputtering target. In particular, a sputtering target comprising a backing plate and the yttrium ingot is preferable.

Regarding bonding surfaces of the yttrium ingot and the backing plate, the bonding surface of the yttrium ingot preferably has a surface roughness (surface roughness of bonding side) of 10 nm or greater and 2 μm or less. The surface roughness is more preferably 10 nm or greater and 1 μm or less and even more preferably 10 nm or greater and 0.3 μm or less. When the surface roughness is less than or equal to 2 μm, a surface layer has a reduced specific surface area, and, consequently, an amount of surface oxygen of the yttrium, which is susceptible to oxidation, is reduced. As a result, peeling at an oxidized portion during the bonding can be prevented. Furthermore, in an oxidized state, the bonding surface cannot be processed because of peeling of an oxidized layer, and eventually, a bonding ratio is low. When the surface roughness is greater than or equal to 10 nm, good engagement between the surface and the undercoat surface is achieved, and, therefore, bonding strength is further improved; consequently, a high-power discharge can be carried out. However, since oxidation of the surface layer is promoted, it is preferable to polish the surface after the formation of the target.

Processing methods for adjusting the surface roughness of the sputtering surface are not particularly limited, and it is possible to use a milling machine, an NC machine, a surface grinding machine, a polishing machine or the like. Since the surface layer of yttrium is susceptible to oxidation, it is preferable that the final processing be performed after the formation of the target, for example, after the backing plate and the yttrium ingot are bonded together. In this case, oxidation of the surface in the bonding step can be inhibited, and impurities in the surface layer can be removed by the re-machining. It is preferable that after the sputtering surface of the sputtering target is processed, the sputtering target be packed in vacuum immediately. In this case, oxidation of the surface layer can be inhibited.

The backing plate is used to efficiently attach the ingot, which is the film material portion of a sputtering target, to a sputtering device. In addition, the backing plate can be cooled with water or the like during sputtering, to prevent overheating of the ingot portion. Examples of materials that can be used for the bonding include indium and indium alloys, which have high thermal conductivity and, therefore, can be suitably used as a solder.

A material of the backing plate is not particularly limited and may be copper, stainless steel, titanium or the like.

In a sputtering target comprising a backing plate and the yttrium ingot, it is preferable that a bonding ratio between the yttrium ingot and the backing plate be greater than or equal to 90%. The bonding ratio is more preferably greater than or equal to 95% and even more preferably greater than or equal to 98%. In the instance where the bonding ratio is as described above, heat of the target generated during sputtering is rapidly diffused, which makes it possible to prevent overheating of the sputtering target, thereby preventing the solder material from melting and flowing. Since the surface of the yttrium ingot is oxidized over time, the bonding with a solder material becomes difficult because of the oxidized film. Accordingly, before the bonding, the oxidized layer on the surface of the yttrium is to be removed, and a surface treatment is to be immediately carried out. Methods for the treatment are not particularly limited, and it is preferable to perform a treatment in which a metal having good adhesion to the solder material is applied by using vapor deposition, a plating, an ultrasonic soldering iron or the like. In such a case, the bonding can be accomplished without causing detachment between the solder and the yttrium ingot. Preferably, the surface treatment is performed within three hours after the treatment of the oxide.

The bonding ratio between the yttrium ingot and the backing plate can be determined, for example, by ultrasonic testing. In the instance where the bonding ratio is determined by ultrasonic testing, it is preferable that the measurement conditions be adjusted by using a false defective sample provided with a false void hole in a middle of a plate material having a predetermined size. The sensitivity of the measurement is to be adjusted such that an area of a detected defect coincides with an area of the predetermined void hole. It is preferable that a material of the false defective sample be the same as a material of the sputtering target. It is preferable that a distance between an ultrasonic incident surface and a bottom surface of the void hole in the false defective sample be equal to a distance between an ultrasonic incident surface and the bonding layer in the sputtering target.

Furthermore, films can be manufactured by performing sputtering with the obtained yttrium sputtering target.

EXAMPLES

The present invention will be described in more detail below with reference to examples. The present invention is not intended to be limited by the examples. Note that the measurements in the present examples were performed as follows.

(1) Relative Density

The relative density was determined as follows: a bulk density was measured in accordance with JIS R 1634, by using an Archimedes method, and the bulk density was divided by the true density of yttrium metal (4.47 g/cm$^3$) to give the relative density.

(2) Measurement of Porosity

In a fluoroscopic X-ray image, the entire image was measured, and regions of pores of 100 μm or greater in the image were extracted. Then, the number and the size of the pores were measured, and the "number/cm²" was calculated from the measured area.

(3) Volume Resistivity

A measurement was conducted at three or more points with a four-probe method, and the results were averaged.

(4) Average Grain Size (D50)/(D50-2)

Mirror polishing was performed, and electrolytic etching was then performed. Subsequently, examination was performed with an optical microscope, and, from the obtained microstructure image, the average grain size (D50) was measured with a diameter method. At least three or more randomly selected points were examined, and the measurement was performed on 300 or more grains. As used herein, the term "average value" refers to a 50% grain size.

Mirror polishing was performed, and then, examination was performed with a scanning electron microscope and electron backscattering diffraction (SEM-EBSD) (SEM: manufactured by Jeol Ltd., EBSD: manufactured by Oxford Instruments). From the obtained image, an arithmetic mean grain size (D50-2) was measured. At least three or more randomly selected points were examined. In this instance, a grain, which angle of crystal orientation tilted at equal or larger than 5°, was counted as one grain, and the grain was approximated as a sphere to calculate the diameter. As used herein, the term "average value" refers to a 50% grain size.

(5) Method for Measuring Bonding Ratio

A measurement was performed with an ultrasonic testing device to calculate the bonding ratio.

(6) Measurement of Surface Roughness (Ra)

The surface roughness Ra was measured with a surface roughness measurement instrument manufactured by Mitutoyo Corporation.

(7) Analysis of Fluorine Content and Amount of Metal Impurities

A region extending 1 mm or more from the surface of a heat-treated yttrium ingot was removed by grinding. Subsequently, a sample was cut from a randomly selected portion of the resulting yttrium ingot, and values obtained by analysis of the sample were designated as measurement data.

Measurement method: glow discharge mass spectrometry (GDMS)

Example 1

A specific yttrium ingot processed with a pore treatment was prepared, and the measurements were performed thereon. The obtained results were favorable. The properties of the yttrium ingot are shown in Table 1. Furthermore, the results of a measurement of impurities that were present are shown in Table 2.

Relative density: 100.3%

Porosity: 0.004 (number)/cm²

Surface roughness: 430 nm (polished with #400 sandpaper)

Before bonding, the bonding surface was polished with #400 sandpaper to a predetermined roughness. Immediately thereafter (within one hour), an indium solder was applied with an ultrasonic soldering iron, and a surface treatment was performed. Subsequently, the resultant was bonded to a backing plate with the indium solder. The properties of the yttrium target are shown in Table 1.

Examples 2 and 3

Yttrium ingots and yttrium targets were produced in a manner similar to that of Example 1, except that the method for the surface treatment was changed. The properties of the yttrium ingots are shown in Table 1.

1000 sandpaper was used for Example 2, and #3000 sandpaper for Example 3. The surface roughness is shown in Table 1.

Comparative Example 1

In Comparative Example 1, the portion that was to become a sputtering surface in the prepared ingot was polished with #80 sandpaper, and before bonding, the bonding surface was polished with #400 sandpaper to a predetermined roughness. Immediately thereafter (within one hour), an indium solder was applied with an ultrasonic soldering iron, and a surface treatment was performed. Subsequently, an yttrium ingot and an yttrium sputtering target, which were not packed in vacuum, were produced.

The bonding ratio of the sputtering targets of Examples 1 to 3 and Comparative Example 1 was measured. The measurement of the bonding ratio was carried out with a Scanning Acoustic Tomograph (model: AT LINE, manufactured by Hitachi Kenki FineTech Co., Ltd.), to which an ultrasonic probe (model: I3-0508-T) was attached for the measurement. Prior to the measurement, the sensitivity was adjusted by using a false sample made of the same material as that of the sputtering target, such that an area of a detected defect coincided with an area of a false hole of the false sample. The measurement conditions were as follows.

Gain (intensity of acoustic wave): 15 dB

Measurement interval: 0.61 mm

Echo level: ≥3.1 V

Incidence of ultrasonic waves: target side

The bonding ratio of the sputtering target was measured with an analysis program included with the instrument. The results of the measurement are shown in Table 1.

Each of the sputtering targets of Examples 1 to 3 was installed in a DC sputtering system, and a film was deposited on a quartz substrate. Subsequently, annealing was performed in an oxygen atmosphere to produce an yttrium oxide film. The sputtering conditions were as follows.

Target size: φ101.6×6 mmt

Power: 200 W

Sputtering gas: Ar

Gas Pressure: 0.5 Pa

Film thickness: 5 μm

In an instance of sputtering of the sputtering target of Comparative Example 1, a DC discharge could not be carried out because, as a result of a high surface roughness of the sputtering surface of the yttrium target, oxidation proceeded, which resulted in a high resistance of the surface layer.

The number of arcing counts during the film deposition is shown in Table 3. For the arcing, the number of times that a voltage drop of 20 V or more from the film deposition voltage occurred was counted. In all of the Examples 1 to 3, the number of arcing counts was small that is, fewer than one time per hour. In the instance where the number of arcing counts is small, the formation of particles can be reduced.

TABLE 1

| | Yttrium ingot | | | | | | | Yttrium target | | |
|---|---|---|---|---|---|---|---|---|---|---|
| | Fluorine content wt % | Relative density % | Porosity number/ cm$^2$ | Surface roughness of sputtering surface Ra nm | Average grain size D50 μm | Volume resistivity Ω·cm | Purity % | Surface roughness of bonding surface Ra nm | Bonding ratio % | DC Discharge |
| Example 1 | 0.6 | 100.3 | 0.004 | 404 | 830 | 6.8 × 10$^{-5}$ | 99.3 | 404 | 91 | ○ |
| Example 2 | 0.6 | 100.3 | 0.004 | 260 | 830 | 6.8 × 10$^{-5}$ | 99.3 | 260 | 95 | ○ |
| Example 3 | 0.6 | 100.3 | 0.004 | 65 | 830 | 6.8 × 10$^{-5}$ | 99.3 | 65 | 98 | ○ |
| Comparative Example 1 | 0.6 | 100.3 | 0.004 | 2500 | 830 | 6.8 × 10$^{-5}$ | 99.3 | 430 | 95 | × |

TABLE 2

| Example 1 | | | | | | | | | |
|---|---|---|---|---|---|---|---|---|---|
| | Li | Be | B | Na | Mg | Al | K | Ca | Sc | Ti |
| [wt ppm] | <0.1 | <0.5 | <0.1 | 0.67 | <0.5 | 40 | <0.5 | 19 | <0.05 | 0.72 |
| | V | Cr | Mn | Fe | Co | Ni | Cu | Zn | Ga | Ge |
| [wt ppm] | <0.5 | 0.95 | 96 | 99 | 0.29 | 1.5 | 0.52 | <0.5 | <0.5 | <0.5 |
| | Rb | Sr | Zr | Nb | Mo | Ru | Rh | Pd | Ag | |
| [wt ppm] | <0.5 | <1 | <0.1 | 0.08 | <1 | <0.5 | <1 | <1 | <1 | |
| | Cd | In | Sn | Sb | Cs | Ba | La | Ce | Pr | Nd |
| [wt ppm] | <1 | <1 | <5 | <0.5 | <0.1 | <0.1 | 0.62 | <0.1 | 8.3 | 35 |
| | Sm | Eu | Gd | Tb | Dy | Ho | Er | Tm | Yb | Lu |
| [wt ppm] | <0.5 | <0.5 | 7.2 | 1.6 | 0.72 | <0.5 | <0.5 | <0.5 | <0.5 | <0.5 |
| | Hf | Ta | W | Re | Os | Ir | Pt | Au | Hg | Tl |
| [wt ppm] | <0.5 | <1 | 670 | <0.5 | <1 | <0.5 | <0.5 | <0.5 | <5 | <0.5 |
| | Pb | | Bi | | Th | | U | | | |
| [wt ppm] | 1.2 | | <0.1 | | <0.05 | | <0.05 | | | |

TABLE 3

| | Arcing (number of counts/hour) |
|---|---|
| Example 1 | <1 |
| Example 2 | <1 |
| Example 3 | <1 |

Comparative Example 2

A process was performed in a manner similar to that of Example 1, except that a specific yttrium ingot was prepared with no treatment for reducing pores being performed thereon. The properties of the obtained ingot are shown in Table 4.

Comparative Example 3

An yttrium ingot was produced with a thermal spray process. The properties of the obtained ingot are shown in Table 4.

TABLE 4

| | Yttrium ingot | | | | | | | Yttrium target | |
|---|---|---|---|---|---|---|---|---|---|
| | Fluorine content wt % | Relative density % | Porosity number/ cm² | Surface roughness of sputtering surface Ra nm | Average grain size D50 μm | Volume resistivity Ω · cm | Purity % | Surface roughness of bonding surface Ra nm | Bonding ratio % | DC Discharge |
| Comparative Example 2 | 0.6 | 94.3 | 2 | 450 | 3300 | 100 | 99.3 | 450 | 90 | x |
| Comparative Example 3 | 0.6 | 88 | 30 | 2500 | 6500 | 19000 | 99.8 | — | — | |

Example 4

An yttrium ingot containing yttrium oxyfluoride was obtained by subjecting yttrium fluoride to a reduction process that used Li—Mg. Furthermore, the yttrium ingot was subjected to a treatment for reducing pores, and the resulting yttrium ingot was subjected to the measurements. The obtained results were favorable. The properties of the yttrium ingot are shown in Table 5. Furthermore, the results of metal impurities that were present are shown in Table 6.
Relative density: 100.3%
Fluorine atom content: 0.6 wt %
Before bonding, the bonding surface was polished to a predetermined roughness. Immediately thereafter, an indium solder was applied with an ultrasonic soldering iron, and a surface treatment was performed. Subsequently, the yttrium ingot was bonded to a backing plate with the indium solder. The properties of the yttrium target are shown in Table 5.

Examples 5 to 6

Yttrium ingots of Examples 5 and 6, which contained yttrium oxyfluoride, and sputtering targets thereof were produced as in Example 4, except that the amount of addition of yttrium fluoride was changed from that of Example 4. The properties of the yttrium ingots and the properties of the targets are shown in Table 5.

Example 7

Yttrium powder (manufactured by Nippon Yttrium Co., Ltd., 3N, lump) and yttrium oxyfluoride powder (manufactured by Nippon Yttrium Co., Ltd., grade: 5LW230) were added to a Cu crucible in a weight ratio of 90:10. Heating and melting were performed in an arc melting furnace, and subsequently, cooling was taken place. In this manner, an yttrium ingot containing yttrium oxyfluoride was obtained. The obtained yttrium ingot was machined to a predetermined shape and was subsequently attached to a backing plate as in Example 4, to produce a sputtering target. The properties of the yttrium ingot and the properties of the target are shown in Table 5.

Example 8

Yttrium oxyfluoride and Yttrium powder were added to a Cu crucible in a weight ratio of 50:50, as same method in Example 7. Heating and melting were performed in an arc melting furnace, and subsequently, cooling was taken place. In this manner, an yttrium ingot containing yttrium oxyfluoride was obtained. The yttrium ingot was attached to a backing plate as in Example 4, to produce a sputtering target. The properties of the yttrium ingot and the properties of the target are shown in Table 5.

Example 9

Yttrium oxyfluoride and Yttrium powder were added to a Cu crucible in a weight ratio of 40:60, as same method in Example 7. Heating and melting were performed in an arc melting furnace, and subsequently, cooling was taken place. In this manner, an yttrium ingot containing yttrium oxyfluoride was obtained. The yttrium ingot was attached to a backing plate as in Example 4, to produce a sputtering target. The properties of the yttrium ingot and the properties of the target are shown in Table 5.

Comparative Example 4

An yttrium ingot free of fluorine, which was synthesized by using a molten salt electrolysis of chlorides, was prepared. The yttrium ingot was attached to a backing plate as in Example 4, to produce a sputtering target. The properties of the yttrium ingot and the properties of the targets are shown in Table 5.

Comparative Example 5

Yttrium oxyfluoride and Yttrium powder were added to a Cu crucible in a weight ratio of 30:70, as same method in Example 7. The yttrium ingot was attached to a backing plate as in Example 4, to produce a sputtering target. The properties of the yttrium ingots and the properties of the targets are shown in Table 5.

The bonding ratio of the sputtering targets of Examples 4 to 9 and Comparative Examples 4 and 5 was measured. The measurement of the bonding ratio was carried out with a Scanning Acoustic Tomograph (model: AT LINE, manufactured by Hitachi Kenki FineTech Co., Ltd.), to which an ultrasonic probe (model: I3-0508-T) was attached for the measurement. Prior to the measurement, the sensitivity was adjusted by using a false sample made of the same material as that of the sputtering target, such that an area of a detected defect coincided with an area of a false hole of the false sample. The measurement conditions were as follows.

Gain (intensity of acoustic wave): 15 dB
Measurement interval: 0.61 mm
Echo level: ≥3.1 V
Incidence of ultrasonic waves: target side The bonding ratio of the sputtering target was measured with an analysis program included with the instrument. The results of the measurement are shown in Table 5.

Each of the sputtering targets of Examples 4 to 7 was installed in a DC sputtering system, and a film was deposited on a quartz substrate. Subsequently, annealing was performed in an oxygen atmosphere to produce an yttrium oxide film. The sputtering conditions were as follows.

Target size: φ101.6×6 mmt
Power: 200 W
Sputtering gas: Ar
Gas Pressure: 0.5 Pa
Film thickness: 5 μm In an instance of sputtering of the sputtering target of Comparative Example 4, a DC discharge could not be carried out because oxidation of the sputtering surface of the yttrium target proceeded, and bonding ratio was low.

In an instance of sputtering of the sputtering target of Comparative Example 5, a DC discharge could not be carried out because the bulk resistivity was high.

Each of the samples obtained in Examples 4 to 7 was set in an etching chamber in which plasma resistance can be evaluated. Based on the difference in the film thickness between before and after the plasma irradiation, an etching rate was calculated. The conditions for the evaluation of plasma resistance were as follows.

Sample size: 20 mm×20 mm
Power: 300 W
Etching gas: Ar+$CF_4$+$O_2$
Etching time: 4 hours The results of the evaluation of plasma resistance are shown in Table 7.

The yttrium films of Examples 4 to 7 had an extremely low etching rate with respect to the quartz substrate and, therefore, had good plasma resistance.

TABLE 5

| | Yttrium ingot | | | | | | | | | Yttrium target | | |
|---|---|---|---|---|---|---|---|---|---|---|---|---|
| | YOF | | | | Surface roughness of sputtering surface Ra nm | Average grain size D50-2 μm | Volume resistivity Ω·cm | Purity(100-RE) % | Surface roughness of bonding surface Ra nm | Bonding ratio % | DC Discharge |
| | Fluorine content wt % | Crystal phases | abundance ratio % | Relative density % | Porosity number/$cm^2$ | | | | | | | |
| Example 4 | 0.6 | Y, YOF | 0.5 | 100.3 | 0.004 | 404 | 7 | $6.8 \times 10^{-5}$ | 99.9 | 404 | 91 | ○ |
| Example 5 | 0.06 | Y, YOF | 0.05 | 100.3 | 0.004 | 404 | 10 | $6.2 \times 10^{-5}$ | 99.9 | 404 | 91 | ○ |
| Example 6 | 4.5 | Y, YOF | 5.5 | 100.3 | 0.004 | 404 | 6 | $7.4 \times 10^{-5}$ | 99.9 | 404 | 91 | ○ |
| Example 7 | 1.6 | Y, YOF | 1 | 99.9 | 0.01 | 404 | 6 | $7.0 \times 10^{-5}$ | 99.9 | 404 | 91 | ○ |
| Example 8 | 7.8 | Y, YOF | 16 | 99.8 | 0.01 | 520 | 2.2 | $1.7 \times 10^{-4}$ | 99.9 | 520 | 90 | ○ |
| Example 9 | 9.4 | Y, YOF | 27 | 99.8 | 0.01 | 520 | 2 | $3.6 \times 10^{-4}$ | 99.9 | 520 | 90 | ○ |
| Comparative Example 4 | 0 | Y | 0 | 99.5 | 1 | 560 | 3800 | $4 \times 10^{-2}$ | 98 | 560 | 70 | x |
| Comparative Example 5 | 10.9 | Y, YOF | 51 | 99.8 | 0.01 | 500 | 2 | $2.2 \times 10^{-3}$ | 99.9 | 404 | 91 | x |

TABLE 6

| | Example 4 | | | | | | | | |
|---|---|---|---|---|---|---|---|---|---|
| | Li | Be | B | Na | Mg | Al | K | Ca | Sc | Ti |
| [wt ppm] | <0.1 | 0.5 | <0.1 | 0.67 | <0.5 | 40 | <0.5 | 19 | <0.05 | 0.72 |
| | V | Cr | Mn | Fe | Co | Ni | Cu | Zn | Ga | Ge |
| [wt ppm] | <0.5 | 0.95 | 96 | 99 | 0.29 | 1.5 | 0.52 | <0.5 | <0.5 | <0.5 |
| | Rb | Sr | Zr | Nb | Mo | Ru | Rh | Pd | Ag | |
| [wt ppm] | <0.5 | <1 | <0.1 | 0.08 | <1 | <0.5 | <1 | <1 | <1 | |
| | Cd | In | Sn | Sb | Cs | Ba | La | Ce | Pr | Nd |
| [wt ppm] | <1 | <1 | <5 | <0.5 | <0.1 | <0.1 | 0.62 | <0.1 | 8.3 | 35 |
| | Sm | Eu | Gd | Tb | Dy | Ho | Er | Tm | Yb | Lu |
| [wt ppm] | <0.5 | <0.5 | 7.2 | 1.6 | 0.72 | <0.5 | <0.5 | <0.5 | <0.5 | <0.5 |
| | Hf | Ta | W | Re | Os | Ir | Pt | Au | Hg | Tl |
| [wt ppm] | <0.5 | <1 | 670 | <0.5 | <1 | <0.5 | <0.5 | <0.5 | <5 | <0.5 |
| | Pb | Bi | Th | U | | | | | | |
| [wt ppm] | 1.2 | <0.1 | <0.05 | <0.05 | | | | | | |

TABLE 7

| | Etching rate (Relative value) |
|---|---|
| Example 4 | 0.02 |
| Example 5 | 0.02 |
| Example 6 | 0.02 |
| Example 7 | 0.02 |
| Quartz substrate | 1 |

Reference Example 1

In Reference Example 1, an yttrium sputtering target was produced as in Example 1, except that the polishing of the bonding surface was carried out with #80 sandpaper.

Comparative Example 6

The bonding surface of the yttrium ingot was polished, and after 72 hour, treatments similar to those of Example 1 were performed.

The bonding ratio of the sputtering targets of Reference Example 1 and Comparative Example 6 was measured. The measurement of the bonding ratio was carried out with a Scanning Acoustic Tomograph (model: AT LINE, manufactured by Hitachi Kenki FineTech Co., Ltd.), to which an ultrasonic probe (model: I3-0508-T) was attached for the measurement. Prior to the measurement, the sensitivity was adjusted by using a false sample made of the same material as that of the sputtering target, such that an area of a detected defect coincided with an area of a false hole of the false sample. The measurement conditions were as follows.

Gain (intensity of acoustic wave): 15 dB
Measurement interval: 0.61 mm
Echo level: ≥3.1 V
Incidence of ultrasonic waves: target side The bonding ratio of the sputtering target was measured with an analysis program included with the instrument. The results of the measurement are shown in Table 8.

In an instance of sputtering of the sputtering target of Reference Example 1, a DC discharge could not be carried out because thermal conductivity was low as a result of a small bonding area, which was attributable to peeling that occurred in the bonding step due to a high surface roughness of the bonding surface.

In an instance of sputtering of the sputtering target of Comparative Example 6, a DC discharge could not be carried out because the bonding ratio was low, which was assumed to be due to peeling of an oxidized layer.

Although the present invention has been described in detail with reference to particular embodiments, it will be apparent to those skilled in the art that various changes and modifications can be made without departing from the spirit and scope of the present invention.

The present application is based on Japanese Patent Application filed on Apr. 23, 2020 (Japanese Patent Application No. 2020-076659), Japanese Patent Application filed on Apr. 23, 2020 (Japanese Patent Application No. 2020-076665), Japanese Patent Application filed on May 14, 2020 (Japanese Patent Application No. 2020-085139) and Japanese Patent Application filed on May 14, 2020 (Japanese Patent Application No. 2020-085189), the entire disclosures of which are incorporated herein by reference. Furthermore, all references cited herein are incorporated in their entireties.

The invention claimed is:

1. An yttrium ingot, comprising:
from 0.05 wt % to 10 wt % of a fluorine atom,
wherein
the number of pores in the yttrium ingot having a diameter of at least 100 μm is 0.1/cm$^2$ or less, and
the yttrium ingot has a relative density of at least 96%.

2. The yttrium ingot according to claim 1, wherein the yttrium ingot has an average grain size (D50) of 3000 μm or less.

3. The yttrium ingot according to claim 1, wherein $98 \leq 100-RE-M < 99.999$ is satisfied, where RE is a rare earth metal content in wt %, and M is a non-rare-earth metal content in wt %.

4. The yttrium ingot according to claim 1, wherein the yttrium ingot comprises yttrium oxyfluoride.

5. The yttrium ingot according to claim 1, wherein $98 \leq 100-RE < 99.999$ is satisfied, where RE is a rare earth metal content in wt %.

6. The yttrium ingot according to claim 1, wherein the yttrium ingot has an average grain size (D50-2) of 100 μm or less.

7. The yttrium ingot according to claim 1, wherein the yttrium ingot has a volume resistivity of 1 Ω·cm or less.

8. An yttrium sputtering target, comprising:
the yttrium ingot according to claim 1,
wherein a sputtering surface of the target has a surface roughness of from 10 nm to 2 μm.

9. The yttrium sputtering target according to claim 8, further comprising:
a backing plate.

10. The yttrium sputtering target according to claim 9, wherein a bonding ratio between the backing plate and the yttrium ingot is at least 90%.

TABLE 8

| | Yttrium ingot | | | | | | | | Yttrium target | |
|---|---|---|---|---|---|---|---|---|---|---|
| | Fluorine content wt % | Relative density % | Porosity number/ cm$^2$ | Surface roughness of sputtering surface Ra nm | Average grain size D50 μm | Volume resistivity Ω·cm | Purity % | Surface roughness of bonding surface Ra nm | Bonding ratio % | DC Discharge |
| Reference Example 1 | 0.6 | 100.3 | 0.004 | 404 | 830 | $6.8 \times 10^{-5}$ | 99.3 | 1500 | 78 | x |
| Comparative Example 6 | 0.6 | 99.5 | 1 | 560 | 3800 | $4 \times 10^{-2}$ | 98.5 | 560 | 70 | x |

11. A method for manufacturing an yttrium oxide film, the method comprising:

performing sputtering with the yttrium sputtering target according to claim 9.

12. The yttrium sputtering target according to claim 8, wherein the surface roughness of the target is from 10 nm to 1 μm.

13. The yttrium ingot according to claim 1, wherein the number of pores in the yttrium ingot having a diameter of at least 100 μm is $0.01/cm^2$ or less.

14. The yttrium ingot according to claim 1, wherein the relative density of the yttrium ingot is at least 98%.

15. The yttrium ingot according to claim 2, wherein the average grain size (D50) of the yttrium ingot is from 1 μm to 2000 μm.

16. The yttrium ingot according to claim 1, wherein $99 \leq 100-RE-M < 99.999$ is satisfied, where RE is a rare earth metal content in wt %, and M is a non-rare-earth metal content in wt %.

17. The yttrium ingot according to claim 1, wherein the yttrium ingot has a volume resistivity of from 0.00001 Ω·cm to 1 Ω·cm.

18. The yttrium ingot according to claim 1, wherein the yttrium ingot has a volume resistivity of from 0.00001 Ω·cm to 0.001 Ω·cm.

* * * * *